(12) United States Patent
Xiong et al.

(10) Patent No.: US 9,379,318 B2
(45) Date of Patent: Jun. 28, 2016

(54) METHOD FOR FORMING A MAGNETIC SENSOR

(71) Applicant: Shanghai Huahong Grace Semiconductor Manufacturing Corporation, Shanghai (CN)

(72) Inventors: Lei Xiong, Shanghai (CN); Pei Xi, Shanghai (CN); Zhenxing Zhang, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 3 days.

(21) Appl. No.: 14/584,537

(22) Filed: Dec. 29, 2014

(65) Prior Publication Data

US 2015/0194600 A1      Jul. 9, 2015

(30) Foreign Application Priority Data

Jan. 7, 2014   (CN) .......................... 2014 1 0006628

(51) Int. Cl.
*H01L 43/12*      (2006.01)
(52) U.S. Cl.
CPC ...................... *H01L 43/12* (2013.01)
(58) Field of Classification Search
CPC ...................................... H01L 43/12
USPC ............................................................ 438/3
See application file for complete search history.

(56) References Cited

U.S. PATENT DOCUMENTS

| 2009/0059656 A1* | 3/2009 | Kanakasabapathy . H01L 23/544 365/158 |
| 2012/0217960 A1 | 8/2012 | Ausserlechner |

FOREIGN PATENT DOCUMENTS

CN          102650683 A       8/2012

* cited by examiner

*Primary Examiner* — Edward Wojciechowicz
(74) *Attorney, Agent, or Firm* — Harness, Dickey & Pierce, P.L.C.

(57) ABSTRACT

A method for forming a magnetic sensor includes: forming a hard mask film on a tantalum nitride film; forming a patterned photoresist layer on the hard mask film; implementing an isotropic dry etching process to the hard mask film by taking the photoresist layer as a mask, so as to form a hard mask layer; and implementing an etching process to the tantalum nitride film and the magnetic film by taking the hard mask layer as a mask, so as to form a tantalum nitride layer and a magnetic resistive layer. As an isotropic dry etching process is implemented to the hard mask film, the hard mask film located which is above the other sidewalls and is not used for forming the magnetic sensor can be effectively removed. In addition, shadow effect will not take place, thus dimension of the magnetic sensor formed is able to be easily controlled.

12 Claims, 3 Drawing Sheets

METHOD FOR FORMING A MAGNETIC SENSOR

CROSS-REFERENCE TO RELATED APPLICATIONS

The present application claims priority to Chinese patent application No. 201410006628.2, filed on Jan. 7, 2014, and entitled "METHOD FOR FORMING A MAGNETIC SENSOR", the entire disclosure of which is incorporated herein by reference.

TECHNICAL FIELD

The present disclosure generally relates to semiconductor manufacturing technology, and more particularly, to a method for forming a magnetic sensor.

BACKGROUND

Magnetic sensors are devices adapted to sensing magnetic fields and transforming variations thereof into electrical signals, and thereby outputting the electrical signals. Magnetic sensors have different types, including giant magneto resistive (GMR) sensors, anisotropic magneto resistive (AMR) sensors, and the like. Taking an AMR sensor for example, it may include a layer of NiFe alloy which serves as a magnetic resistive layer. When an external magnetic field is applied to the magnetic resistive layer, it can cause magnetic domains of the magnetic resistive layer to rotate, thus resistance of the magnetic resistive layer may vary. Variations of the resistance of the magnetic resistive layer can be indicated via variations of output voltages. Accordingly, the external magnetic field is able to be detected.

In recent years, after homotaxial magnetic sensors and biaxial magnetic sensors, anisotropic magneto resistive sensors have come into an era of triaxial (3D) magnetic sensors. In practice, the 3D magnetic sensors are able to detect magnetic signals from three directions (specifically, direction X, direction Y and direction Z) in a detection space. Thus, the 3D magnetic sensors have been widely used.

Nowadays, integrated circuit technologies are applied to the field of magnetic sensor, which accelerates large scale productions of magnetic sensors. Referring FIG. 1 to FIG. 3, an existed process for forming a 3D magnetic sensor is illustrated.

As shown in FIG. 1, the forming process includes: providing a semiconductor substrate 10; forming an insulating layer 11 on the semiconductor substrate 10; forming a groove in the insulating layer 11; forming a diffusion barrier layer 12 on sidewalls and a bottom surface of the groove 11 and a top surface of the insulating layer 11; forming a magnetic film 13 on the diffusion barrier layer 12; and forming a tantalum nitride film 14 on the magnetic film 13.

As shown in FIG. 2, the forming process further includes: forming a photoresist film on the tantalum nitride film 14; and implementing an exposure process to the photoresist film for forming a patterned photoresist layer 15.

As shown in FIG. 3, the forming process further includes: etching the tantalum nitride film 14 by taking the patterned photoresist layer 15 as a mask until the magnetic film 13 is exposed, so as to form a tantalum nitride layer 16; removing the patterned photoresist layer 15; and etching the magnetic film 13 by taking the tantalum nitride layer 16 as a mask, so as to form a magnetic resistive layer 17.

However, it may have some difficulties for precisely controlling dimensions of 3D magnetic sensors by using the existing method.

SUMMARY

A method for forming a magnetic sensor is provided according to one embodiment of the present disclosure, including:
providing a semiconductor substrate;
forming an insulating layer on the semiconductor substrate;
forming a groove in the insulating layer;
forming a diffusion barrier layer on sidewalls and a bottom surface of the groove and a surface of the insulating layer;
forming a magnetic film on the diffusion barrier layer;
forming a tantalum nitride film on the magnetic film;
forming a hard mask film on the tantalum nitride film;
forming a photoresist film on the hard mask film;
implementing an exposure process and a developing process to the photoresist film, so as to form a photoresist layer;
implementing an isotropic dry etching process to the hard mask film by taking the photoresist layer as a mask, so as to form a hard mask layer on a predetermined position of the sidewalls of the groove;
removing the photoresist layer; and
implementing an etching process to the tantalum nitride film and the magnetic film successively by taking the hard mask layer as a mask, so as to form a tantalum nitride layer and a magnetic resistive layer.

Optionally, parameters of the isotropic dry etching process include: an etching gas which includes oxygen and fluorine-contained etching gas, wherein the oxygen has a flow rate ranging from 10 standard milliliters per minute to 50 standard milliliters per minute, and the fluorine-contained etching gas has a flow rate ranging from 10 standard milliliters per minute to 20 standard milliliters per minute; a source RF power which is larger than 800 watts; and a bias RF power which is smaller than 20 watts.

Optionally, a ratio of the oxygen to the fluorine-contained etching gas ranges from 1 to 2.5.

Optionally, the fluorine-contained etching gas includes at least one selected from a group consisting of $CF_4$, $C_2F_6$, $C_4F_8$, $C_2F_6$, $CHF_3$, $NF_3$, $SiF_4$, and $SF_6$.

Optionally, the isotropic dry etching process is an inductive coupling plasma etching process.

Optionally, the hard mask layer has a thickness less than 2000 angstroms.

Optionally, the etching process implemented to the tantalum nitride film and the magnetic film is an ion beam etching, a reactive ion etching or an inductive coupling plasma etching.

Optionally, the hard mask layer includes at least one selected from a group consisting of silicon nitride, silicon oxide and silicon oxynitride.

Optionally, the magnetic film includes NiFe alloy.

Optionally, the tantalum nitride layer and the magnetic resistive layer are formed on a first portion of the diffusion barrier layer which is located on one of sidewalls of the groove, and a second and a third portions of the diffusion barrier layer which are connected with the first portion, and respectively located on the bottom surface of the groove and outside the groove.

In comparison to existed technologies, technical solutions provided by the present disclosure have follow advantages.

As the hard mask film is etched by the isotropic dry etching process, the hard mask film located on the other sidewalls of the groove which is not used for forming the magnetic sensor is able to be effectively removed. Thereafter, the hard mask layer is able to be used as a mask for etching the tantalum nitride film and the magnetic film, so as to form the tantalum nitride layer and the magnetic resistive layer. Furthermore, shadow effect may not take place in the isotropic dry etching process, thus dimensions of the tantalum nitride layer and the magnetic resistive layer ultimately formed are able to be well controlled. Accordingly, dimension of the magnetic sensor formed is able to be easily controlled.

DETAILED DESCRIPTION

In order to clarify the objects, characteristics and advantages of the present disclosure, embodiments of the present disclosure will be described in detail in conjunction with the accompanying drawings. The disclosure will be described with reference to certain embodiments. Accordingly, the present disclosure is not limited to the embodiments disclosed. It will be understood by those skilled in the art that various changes may be made without departing from the spirit or scope of the disclosure.

Figure 2:
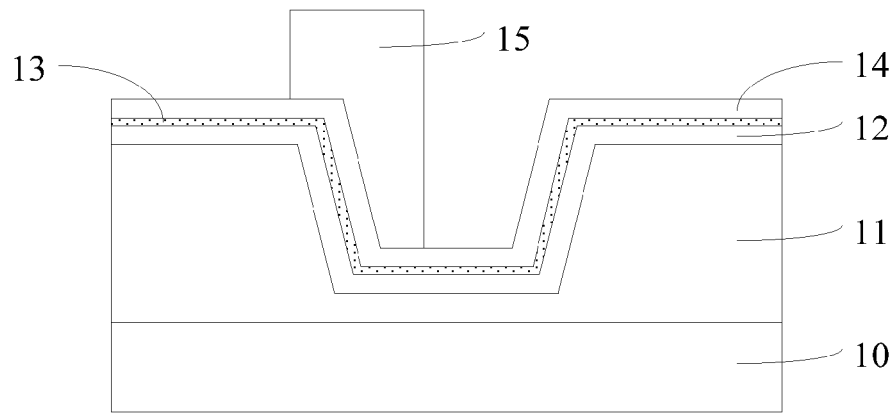
Figure 3:
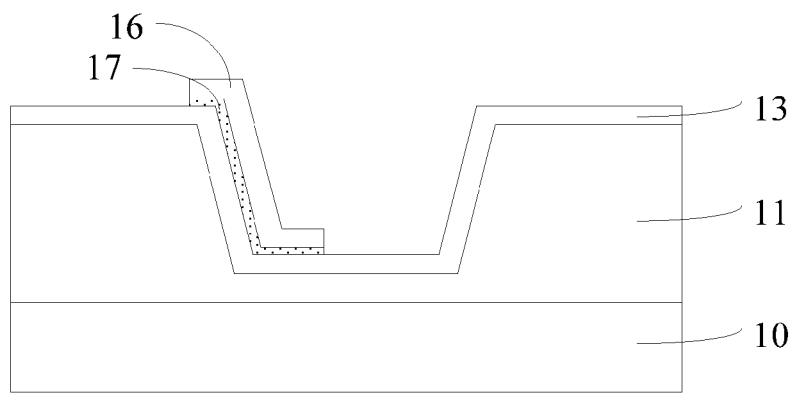

As mentioned in the background, it may have some difficulties for precisely controlling dimensions of 3D magnetic sensors through existing methods. Specifically, referring to FIG. 2 and FIG. 3, the tantalum nitride layer 16 and the magnetic resistive layer 17 are ultimately formed on a portion of the diffusion barrier layer, which is located on a particular sidewall of the groove, a portion of the diffusion barrier layer which is located on the bottom surface of the groove and connected to the particular sidewall, and a portion of the diffusion barrier layer which is located outside the groove and connected to the particular sidewall. Accordingly, to form the tantalum nitride layer 16 and the magnetic resistive layer 17 with that profile, the patterned photoresist layer 15 is required to cover the particular sidewall, and both the particular portion of the groove bottom and the particular portion of the structure out of the groove top. As a result, since the groove is relative deep, the patterned photoresist layer 15 required to extend from the bottom of the groove to beyond the top of the groove shall has a relatively large thickness. In some occasions, the photoresist layer 15 which is located on the bottom of the groove has a larger thickness which may reach three microns.

In practice, anisotropic etching processes are generally used for etching the tantalum nitride film and the magnetic film. Meanwhile, in order to remove portion of the tantalum nitride film and the magnetic film which are located on the other sidewalls of the groove and are not used for forming the magnetic sensor, the blasting direction of etching ions will not be perpendicular to the semiconductor substrate. However, due to the relatively large thickness thereof, the photoresist layer may block some of the etching ions which are supposed to reach a region closed to the patterned photoresist layer, thus a shadow effect may happen. As a result, a portion of the tantalum nitride layer 16 and a portion of the magnetic resistive layer 17 which are closed to the patterned photoresist layer can not be etched due to the shadow effect. Therefore, the tantalum nitride layer 16 and the magnetic resistive layer 17 ultimately formed may have larger dimensions than that of the patterned photoresist layer 15, i.e., larger than the designed dimensions. In addition, the photoresist layer 15 probably may not be formed evenly throughout the whole wafer surface, but have slight thickness deviations between central portions and edge portions, which means dimensions of the tantalum nitride layer 16 and the magnetic resistive layer 17 can not be easily controlled via calculating the thickness of the photoresist layer 15 and the etching angle.

Referring to FIG. 4 to FIG. 9, a method for forming a 3D magnetic sensor according to one embodiment of the present disclosure is illustrated.

Figure 4:
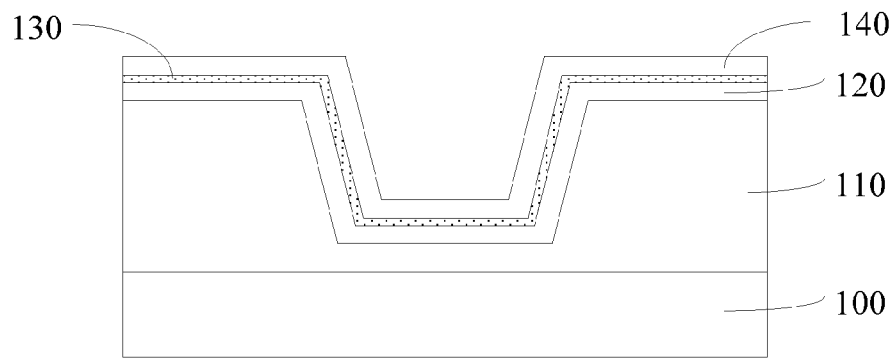
FIGS. 4-9 schematically illustrate cross-sectional diagrams of a method for forming a 3D magnetic sensor according to one embodiment of the present disclosure.
Figure 5:
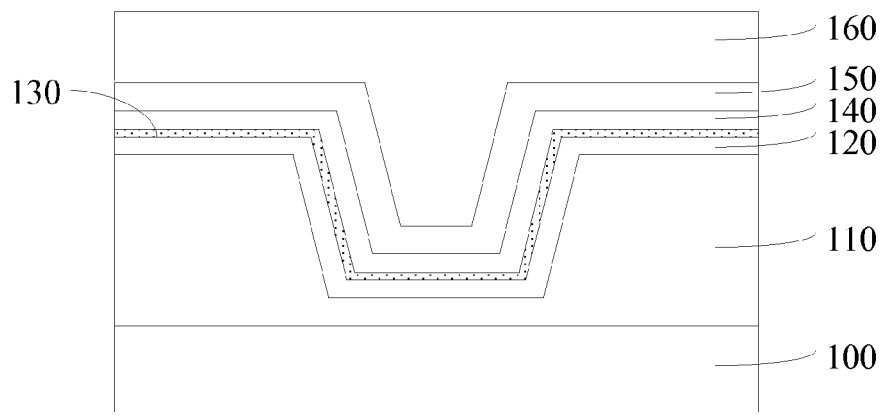

As shown in FIG. 4, the method includes: providing a semiconductor substrate 100; forming an insulating layer 110 on the semiconductor substrate 100; forming a groove in the insulating layer 110; forming a diffusion barrier layer 120 on sidewalls and a bottom of the groove and a top surface of the insulating layer 110; forming a magnetic film 130 on the diffusion barrier layer 120; and forming a tantalum nitride film 140 on the magnetic film 130.

The semiconductor substrate 100 may be a silicon substrate, a germanium substrate, a gallium nitride substrate or a silicon substrate on insulator. In the specific embodiment, the semiconductor substrate 100 is a silicon substrate.

The insulating layer 110 is made of silicon oxide. The magnetic sensor formed by the present disclosure is a 3D magnetic sensor, and a magnetic resistive layer is ultimately formed on a first portion of diffusion barrier layer which is located on one of sidewalls of the groove, and a second and a third portions of the diffusion barrier layer which are connected with the first portion, and respectively located on the bottom surface of the groove and outside the groove, so as to sense magnetic signals from direction X, direction Y and direction Z, respectively. Accordingly, the insulating layer 110 has a groove therein, and the groove does not expose the semiconductor substrate 100. In embodiments of the present disclosure, the groove has a depth ranging from 2 micrometers to 4 micrometers.

The diffusion barrier layer 120 is adapted to preventing metallics of the magnetic film 130 from diffusing into the insulating layer, thus short circuit and breakdown are able to be prevented. In the specific embodiment of the present disclosure, the diffusion barrier layer 120 is made of silicon oxide.

The magnetic film 130 is made of NiFe alloy or any other suitable materials. The magnetic film 130 can form the magnetic resistive layer of the magnetic sensor in follow-up processes. When an external magnetic field is applied to the magnetic resistive layer, a magnetic domain of the magnetic resistive layer rotates, thus a resistance of the magnetic resistive layer may vary. Variations of the resistance of the magnetic resistive layer are able to be indicated by variations of an output voltage. Accordingly, detection of the external magnetic field is able to be achieved. The magnetic film 130 may be form by sputtering or any other suitable physical vapor deposition processes.

The tantalum nitride film 140 is formed by sputtering, atomic layer deposition or any other suitable physical vapor deposition processes. The tantalum nitride film 140 servers as a protective layer of the magnetic film, which is adapted to preventing the magnetic film from being exposed to the air. Thus, oxide etch of the magnetic film is able to be avoided.

Furthermore, an electrode which is able to be coupled to an external circuit may be formed on the tantalum nitride film 140 in follow-up processes.

Figure 1:
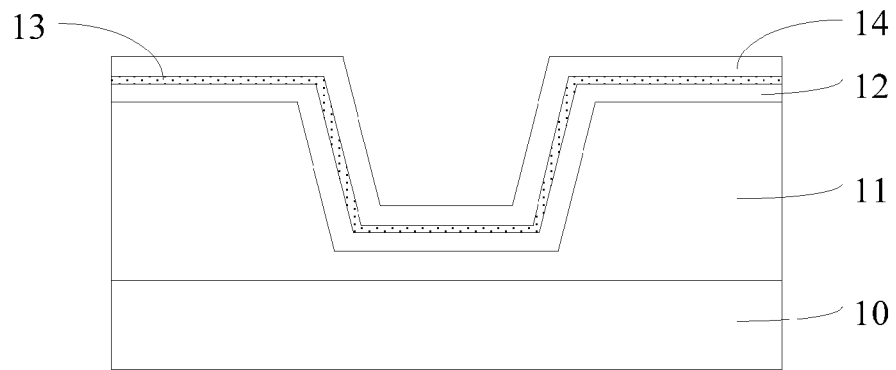
FIGS. 1-3 schematically illustrate cross-sectional diagrams of an existed method for forming a 3D magnetic sensor.

Referring FIG. 1, the method further includes: forming a hard mask film 150 on the tantalum nitride film 140; and forming a photoresist film 160 on the hard mask film 150.

The hard mask film 150 has a thickness less than or equal to 2000 angstroms which is far less than the depth of the groove and a thickness of the photoresist film 160. The hard mask film 150 is able to form a hard mask layer in follow-up processes. Thereafter, etching to the tantalum nitride film and the magnetic film is implement by taking the hard mask layer as a mask, thus shadow effect may not take place. Accordingly, dimensions of the tantalum nitride layer and the magnetic resistive layer ultimately formed are substantially equal to that of the hard mask layer. Therefore, dimension of the magnetic sensor formed is able to be easily regulated via controlling the dimension of the hard mask layer. Further, in some embodiments of the present disclosure, the hard mask film 150 is made of silicon oxide.

The photoresist film 160 is formed by spin-on coating. The photoresist film 160 has a flat surface and completely fills up the groove. In the specific embodiment of the present disclosure, portion of the photoresist film 160 which is located on the hard mask film 150 outside the groove has a thickness larger than 1 micrometer.

Figure 6:
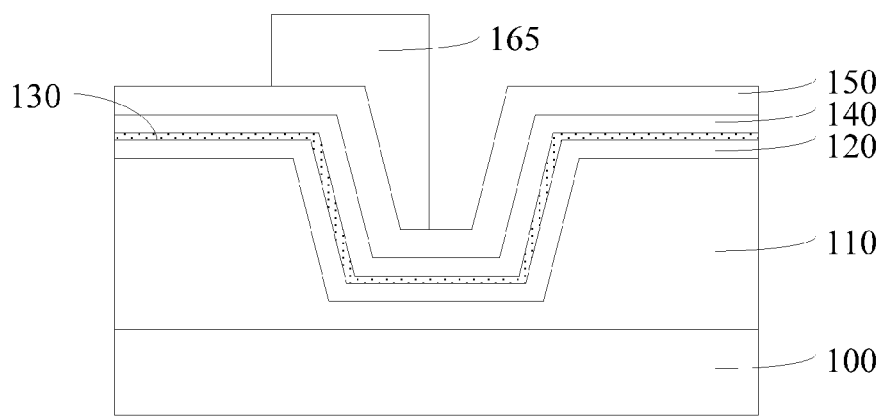

Referring to FIG. 6, the method for forming a magnetic sensor further includes: implementing an exposure process and a developing process to the photoresist film 160 so as to form a patterned photoresist layer 165. Position of the patterned photoresist layer 165 corresponds to position of the follow-up formed magnetic resistive layer.

Figure 7:
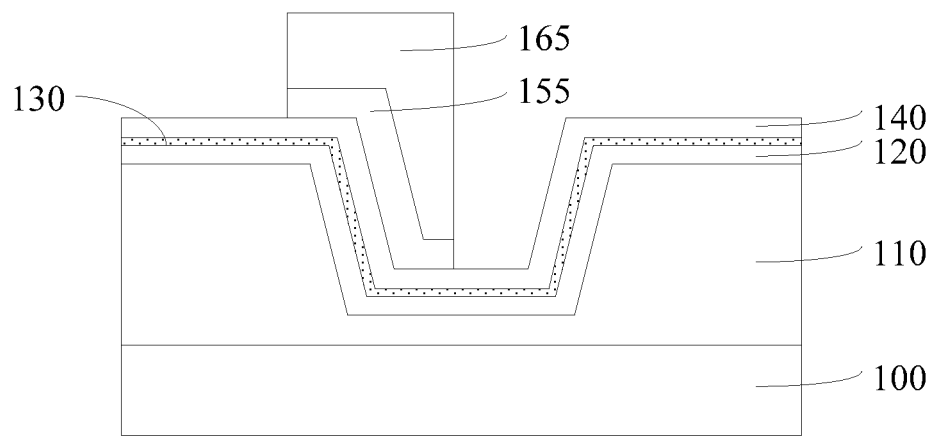

Referring to FIG. 7, the method for forming a magnetic sensor further includes: implementing an isotropic dry etching process to the hard mask film 150 by taking the patterned photoresist layer 165 as a mask, so as to form a hard mask layer 155 on a predetermined position of one of the sidewalls of the groove.

The hard mask layer 155 is formed on the tantalum nitride film 140 which is located on a sidewall of the groove, a portion of the tantalum nitride film 140 which is located on the bottom connected with the sidewall, and a portion of a top surface of the tantalum nitride film 140 which is located outside the groove and connected to the sidewall. Accordingly, the tantalum nitride layer 140 and the magnetic resistive layer formed thereafter are located on a first portion of diffusion barrier layer which is located on one of sidewalls of the groove, and a second and a third portions of the diffusion barrier layer which are connected with the first portion, and respectively located on the bottom surface of the groove and outside the groove, so as to sense magnetic signals from direction X, direction Y and direction Z, respectively. Therefore, the 3D magnetic sensor is formed.

In some embodiments of the present disclosure, the hard mask layer 155 is formed only above one of the sidewalls of the groove, and the hard mask film located above other sidewalls need to be removed. Isotropic dry etching process which is perpendicular to the substrate is only able to remove the hard mask film located on the tantalum nitride which is formed above the bottom of the groove and on the top surface of the tantalum nitride outside the groove. The hard mask film which is located above the other sidewalls of the groove is hard to be removed. Otherwise, if the isotropic dry etching process which has an angle with respect to the substrate is used, shadow effect may take place due to larger thickness of the photoresist layer 165, especially, the photoresist layer 165 located in the groove. As a result, dimension of the hard mask layer 155 is larger than that of the photoresist layer 165. Therefore, dimension of the magnetic sensor formed can not be controlled easily. Accordingly, in some embodiments of the present disclosure, the isotropic dry etching process is used for implementing etching to the hard mask film 150, so that the hard mask film which is located above the other sidewalls and is not covered by the photoresist layer 165 is able to be effectively removed, and shadow effect which may cause hard control to the dimension of the magnetic sensor is avoided.

In some embodiments of the present invention, the isotropic dry etching is an inductive coupling plasma etching which includes two RF power sources. The two RF power sources are respectively a source RF power source and a bias RF power source. The source RF power source is adapted to ionizing an etching gas and controlling quantity of plasmas formed. The bias RF power source is adapted to controlling a blasting velocity of the plasmas to object being etched. The etching gas is essential for implementing the isotropic dry etching. Further, the etching gas includes oxygen and fluorine-contained etching gas. The fluorine-contained etching gas may include at least one selected from a group consisting of $CF_4$, $C_2F_6$, $C_4F_8$, $C_2F_6$, $CHF_3$, $NF_3$, $SiF_4$, and $SF_6$. The oxygen has a flow rate ranging from 10 standard milliliters per minute to 50 standard milliliters per minute, the fluorine-contained etching gas has a flow rate ranging from 10 standard milliliters per minute to 20 standard milliliters per minute. The source RF power source has a RF power range larger than 800 watts and the bias RF power source has a power range smaller than 20 watts. In addition, the isotropic dry etching may have an etching temperature ranging from 40° C. to 80° C.

The bias RF has a small power, thus the blasting velocity of the plasmas is small. Therefore, physical etching has less contribution to the isotropic dry etching process. In the isotropic dry etching process, chemical etching is mainly used for removing the hard mask film 150 being exposed. Furthermore, the source RF power has a wide range, thus energy of the plasmas may be improved. Therefore, an etching rate of the isotropic dry etching process may be improved, which may cue deficiency of low etching rate caused by lacking of physical etching.

In some embodiments of the present disclosure, a ratio of the oxygen to the fluorine-contained etching gas ranges from 1 to 2.5. Both the oxygen and the fluorine-contained etching gas have a lower flow rate. Through adjusting the ratio of the oxygen to the fluorine-contained etching gas, an etching rate for etching materials above the other sidewalls of the groove may be substantially equal to an etching rate for etching materials above the bottom of the groove, thus isotropic etching may be achieved. For example, in the specific embodiment of the present disclosure, the ratio of the oxygen to the fluorine-contained etching gas is set to 2.5. Within a same time period, the hard mask film 150 which is located above the other sidewalls of the groove has 277 angstroms of thickness being etched, while the hard mask film 150 which is located above the bottom of the groove has 292 angstroms of thickness being etched. It can be seen that, the ratio of the etching rate for etching the hard mask film 150 located above the other sidewalls of the groove and an etching rate for etching the hard mask film 150 located above the bottom of the groove is about 1:1. Accordingly, the hard mask film 150 which is located on the sidewall of the groove and is not covered by the photoresist layer 165 is able to be effectively removed.

Furthermore, a portion of the hard mask layer 155 which is located on a margin of the photoresist layer 165 may be etched by the isotropic dry etching process. As a result, the hard mask layer 155 may have an inward concave. In other words, the hard mask layer 155 may have a smaller dimension than that of the photoresist layer 165. However, a width of the hard mask layer 155 being etched by the isotropic dry etching process can be controlled by adjusting an etching time. Accordingly, the hard mask layer 155 which has a desired dimension is able to be obtained by enlarging the dimension of the photoresist layer 165 appropriately. As such, the dimension of the magnetic sensor formed is able to be effectively controlled.

Figure 8:
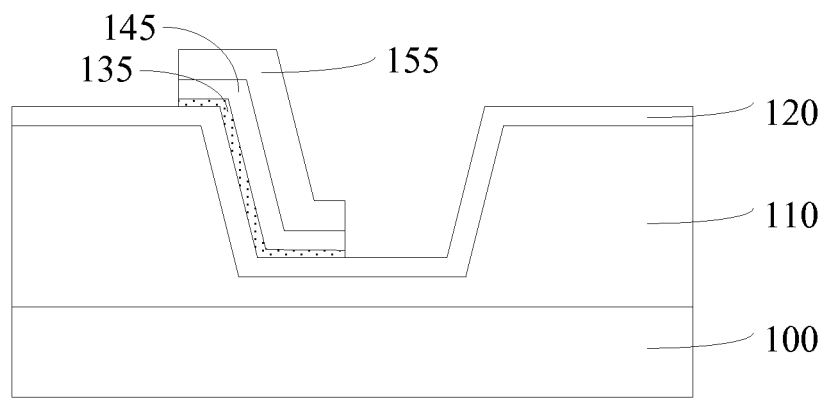

Referring to FIG. 8, the forming method further includes: removing the photoresist layer 165; and implementing etching to the tantalum nitride film 140 and the magnetic film 130 successively by taking the hard mask layer 155 as a mask, so as to form a tantalum nitride layer 145 and a magnetic resistive layer 135.

In some embodiments of the present disclosure, the photoresist layer 165 is removed by an ashing process.

As the hard mask layer 155 has a thickness less than or equal to 2000 angstroms which is far smaller than the depth of the groove and the thickness of the photoresist film 160, shadow effect may not take place when etching the tantalum nitride film and the magnetic film by taking the hard mask layer as a mask. As a result, dimensions of the tantalum nitride layer and the magnetic resistive layer ultimately formed are substantially equal to that of the hard mask layer. Therefore, dimension of the magnetic sensor formed is able to be controlled by adjusting the dimension of the hard mask layer.

In some embodiments of the present disclosure, the tantalum nitride film 140 and the magnetic film 130 are successively etched by taking the hard mask layer 155 as a mask, so as to form a tantalum nitride layer 145 and a magnetic resistive layer 135.

The etching process implemented to the tantalum nitride film 140 and the magnetic film 130 is an ion beam etching (IBE) process, a reactive ion etching (RIE) process, or an inductive coupling plasma (ICP) etching process. In the specific embodiment of the present disclosure, the etching process implemented to the tantalum nitride film 140 and the magnetic film 130 is the IBE process.

In some embodiments of the present disclosure, the tantalum nitride layer and the magnetic resistive layer may be formed by implementing an etching process to the tantalum nitride film 140 firstly by taking the hard mask layer as the mask so as to form the tantalum nitride layer; then removing the hard mask layer; and implementing the etching process to the magnetic film by taking the tantalum nitride layer as a mask so as to from the magnetic resistive layer thereafter.

The tantalum nitride layer 145 and the magnetic resistive layer 135 are formed on the a first portion of diffusion barrier layer which is located on one of sidewalls of the groove, and a second and a third portions of the diffusion barrier layer which are connected with the first portion, and respectively located on the bottom surface of the groove and outside the groove, so that magnetic signals from direction X, direction Y and direction Z are able to be sensed respectively. Therefore, the 3D magnetic sensor is able to be achieved.

Figure 9:
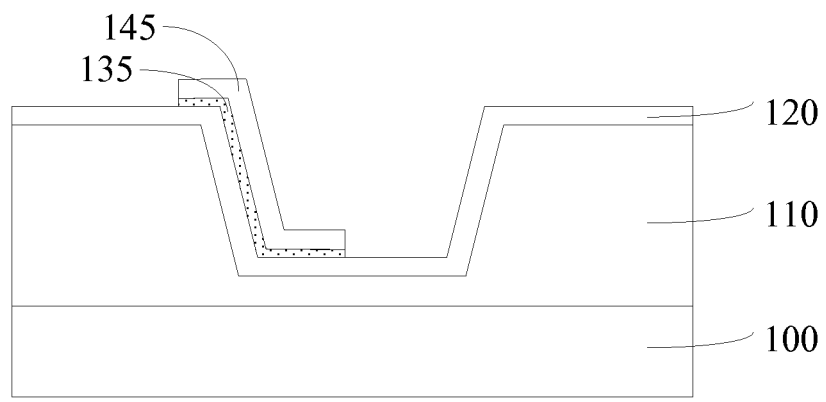

Referring to FIG. 9, the method for forming a magnetic sensor further includes removing the hard mask layer 155. The hard mask layer 155 may be removed by a wet etching process or a dry etching process.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. A method for forming a magnetic sensor comprising:
providing a semiconductor substrate;
forming an insulating layer on the semiconductor substrate;
forming a groove in the insulating layer;
forming a diffusion barrier layer on sidewalls and a bottom surface of the groove and a surface of the insulating layer;
forming a magnetic film on the diffusion barrier layer;
forming a tantalum nitride film on the magnetic film;
forming a hard mask film on the tantalum nitride film;
forming a photoresist film on the hard mask film;
implementing an exposure process and a developing process to the photoresist film, so as to form a pattered photoresist layer;
implementing an isotropic dry etching process to the hard mask film by taking the photoresist layer as a mask, so as to form a hard mask layer on a predetermined position of the sidewalls of the groove;
removing the photoresist layer; and
implementing an etching process to the tantalum nitride film and the magnetic film successively by taking the hard mask layer as a mask, so as to form a tantalum nitride layer and a magnetic resistive layer.

2. The method according to claim 1, wherein parameters of the isotropic dry etching process comprise: an etching gas which includes oxygen and fluorine-contained etching gas, wherein the oxygen has a flow rate ranging from 10 standard milliliters per minute to 50 standard milliliters per minute, and the fluorine-contained etching gas has a flow rate ranging from 10 standard milliliters per minute to 20 standard milliliters per minute; a source RF power which is larger than 800 watts; and a bias RF power which is smaller than 20 watts.

3. The method according to claim 2, wherein a ratio of the oxygen to the fluorine-contained etching gas ranges from 1 to 2.5.

4. The method according to claim 2, wherein the fluorine-contained etching gas comprises at least one selected from a group consisting of $CF_4$, $C_2F_6$, $C_4F_8$, $C_2F_6$, $CHF_3$, $NF_3$, $SiF_4$, and $SF_6$.

5. The method according to claim 3, wherein the fluorine-contained etching gas comprises at least one selected from a group consisting of $CF_4$, $C_2F_6$, $C_4F_8$, $C_2F_6$, $CHF_3$, $NF_3$, $SiF_4$, and $SF_6$.

6. The method according to claim 1, wherein the isotropic dry etching process is an inductive coupling plasma etching process.

7. The method according to claim 2, wherein the isotropic dry etching process is an inductive coupling plasma etching.

8. The method according to claim 1, wherein the hard mask layer has a thickness less than 2000 angstroms.

9. The method according to claim 1, wherein the etching process implemented to the tantalum nitride film and the magnetic film is an ion beam etching, a reactive ion etching or an inductive coupling plasma etching.

10. The method according to claim 1, wherein the hard mask layer comprises at least one selected from a group consisting of silicon nitride, silicon oxide and silicon oxynitride.

11. The method according to claim 1, wherein the magnetic film comprises FeNi alloy.

12. The method according to claim 1, wherein the tantalum nitride layer and the magnetic resistive layer are formed on a first portion of the diffusion barrier layer which is located on one of sidewalls of the groove, and a second and a third portions of the diffusion barrier layer which are connected with the first portion, and respectively located on the bottom surface of the groove and outside the groove.

* * * * *